(12) United States Patent
Vadhavkar

(10) Patent No.: US 10,079,333 B2
(45) Date of Patent: Sep. 18, 2018

(54) SOLID-STATE RADIATION TRANSDUCER DEVICES HAVING FLIP-CHIP MOUNTED SOLID-STATE RADIATION TRANSDUCERS AND ASSOCIATED SYSTEMS AND METHODS

(71) Applicant: Micron Technology, Inc., Boise, ID (US)

(72) Inventor: Sameer S. Vadhavkar, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/490,859

(22) Filed: Apr. 18, 2017

(65) Prior Publication Data

US 2017/0222111 A1    Aug. 3, 2017

Related U.S. Application Data

(60) Continuation of application No. 14/603,102, filed on Jan. 22, 2015, now Pat. No. 9,647,167, which is a
(Continued)

(51) Int. Cl.
*H01L 33/58* (2010.01)
*H01L 33/62* (2010.01)
(Continued)

(52) U.S. Cl.
CPC ............ *H01L 33/62* (2013.01); *H01L 33/486* (2013.01); *H01L 33/507* (2013.01); *H01L 33/54* (2013.01);
(Continued)

(58) Field of Classification Search
CPC ................ H01L 31/02; H01L 31/0725; H01L 31/02008; H01L 33/58; H01L 33/60; H01L 33/64
See application file for complete search history.

(56) References Cited

U.S. PATENT DOCUMENTS

| | | |
|---|---|---|
| 6,028,011 A | 2/2000 | Takase et al. |
| 7,655,956 B2 | 2/2010 | Sunohara et al. |
| (Continued) | | |

FOREIGN PATENT DOCUMENTS

| | | |
|---|---|---|
| CN | 101268554 | 9/2008 |
| CN | 101771117 A | 7/2010 |
| (Continued) | | |

OTHER PUBLICATIONS

CN Patent Application No. 201280041684.9—Chinese Office Action, dated Jun. 9, 2017, with English Translation, 20 pages.
(Continued)

*Primary Examiner* — Cuong Q Nguyen
(74) *Attorney, Agent, or Firm* — Perkins Coie LLP

(57) ABSTRACT

Solid-state radiation transducer (SSRT) devices and methods of manufacturing and using SSRT devices are disclosed herein. One embodiment of the SSRT device includes a radiation transducer (e.g., a light-emitting diode) and a transmissive support assembly including a transmissive support member, such as a transmissive support member including a converter material. A lead can be positioned at a back side of the transmissive support member. The radiation transducer can be flip-chip mounted to the transmissive support assembly. For example, a solder connection can be present between a contact of the radiation transducer and the lead of the transmissive support assembly.

12 Claims, 12 Drawing Sheets

Related U.S. Application Data division of application No. 13/219,530, filed on Aug. 26, 2011, now Pat. No. 8,952,402.

(51) Int. Cl.
  *H01L 33/50* (2010.01)
  *H01L 33/54* (2010.01)
  *H01L 33/48* (2010.01)

(52) U.S. Cl.
  CPC ........ *H01L 33/58* (2013.01); *H01L 2933/005* (2013.01); *H01L 2933/0041* (2013.01); *H01L 2933/0058* (2013.01); *H01L 2933/0066* (2013.01)

(56) References Cited

U.S. PATENT DOCUMENTS

| | | |
|---|---|---|
| 2003/0209714 A1 | 11/2003 | Taskar et al. |
| 2004/0041247 A1* | 3/2004 | Kinsman ............ H01L 31/0203 257/678 |
| 2004/0211972 A1 | 10/2004 | Du et al. |
| 2005/0041935 A1* | 2/2005 | Liu ..................... H01L 24/97 385/92 |
| 2005/0274970 A1 | 12/2005 | Ludowise et al. |
| 2007/0012940 A1 | 1/2007 | Suh et al. |
| 2007/0194691 A1 | 8/2007 | Choo et al. |
| 2007/0252227 A1 | 11/2007 | Fukuda et al. |
| 2009/0032827 A1 | 2/2009 | Smits |
| 2009/0242923 A1 | 10/2009 | Goodrich et al. |
| 2009/0267085 A1 | 10/2009 | Lee et al. |
| 2009/0315051 A1 | 12/2009 | Wu et al. |
| 2010/0038670 A1 | 2/2010 | Panaccione et al. |
| 2011/0031516 A1 | 2/2011 | Basin et al. |
| 2011/0041898 A1 | 2/2011 | Cornfeld et al. |
| 2011/0108865 A1 | 5/2011 | Aldaz et al. |
| 2011/0147775 A1 | 6/2011 | Hikosaka et al. |
| 2011/0193231 A1* | 8/2011 | Elenius ............... H01L 31/0203 257/750 |
| 2013/0049039 A1 | 2/2013 | Vadhavkar |
| 2013/0099264 A1 | 4/2013 | Zimmerman et al. |
| 2015/0132874 A1 | 5/2015 | Vadhavkar |

FOREIGN PATENT DOCUMENTS

| | | |
|---|---|---|
| CN | 201680292 | 12/2010 |
| CN | 102104107 A | 6/2011 |
| EP | 2461380 | 6/2012 |
| JP | 2008251561 | 10/2008 |
| JP | 2009212281 | 9/2009 |
| KR | 20060104165 | 10/2006 |
| KR | 20080092719 | 10/2008 |
| TW | I331413 | 10/2010 |
| TW | 201123565 | 7/2011 |

OTHER PUBLICATIONS

CN Patent Application No. 201280041684.9—Chinese Office Action, dated Jan. 22, 2017, with English Translation, 14 pages.
Office Action dated Nov. 12, 2014 in Tawain Patent Application No. 101130150.
Extended European Search Report dated Feb. 11, 2015 in European Application No. 12827354.7, 14 pages.
International Search Report and Written Opinion dated Mar. 4, 2013 in International Application No. PCT/US2012/051608, 7 pages.
Office Action dated Dec. 3, 2015 in China Application No. 201280041684.9, 17 pages.
Office Action dated Jul. 18, 2016 in China Application No. 201280041684.9, 17 pages.
Office Action dated May 10, 2016 in Japan Application No. 2014-527225, 4 pages.
Office Action dated May 11, 2015 in Korean Patent Application No. 10-2014-7013102, 15 pages.
Tran, N.T. and F.G. Shi, "Studies of Phosphor Concentration and Thickness for Phosphor-Based White Light-Emitting Diode", Journal of Lightwave Technology, vol. 26, No. 21, pp. 3556-3559, Nov. 2008, doi:10.1109/JLT.2008.917087.

* cited by examiner

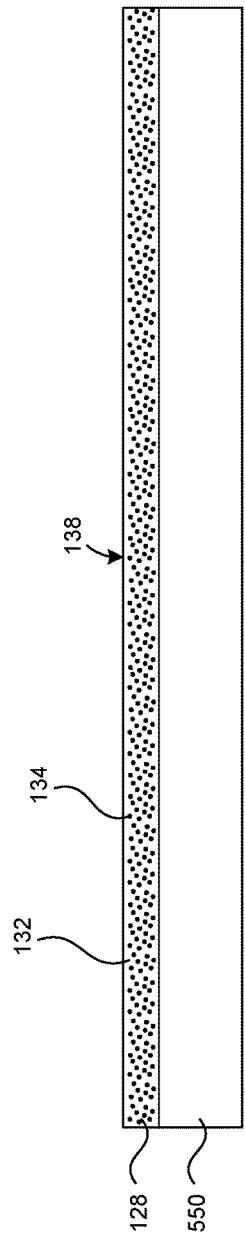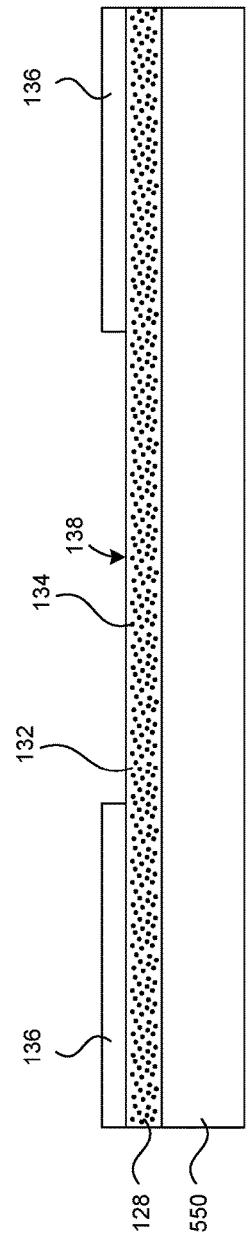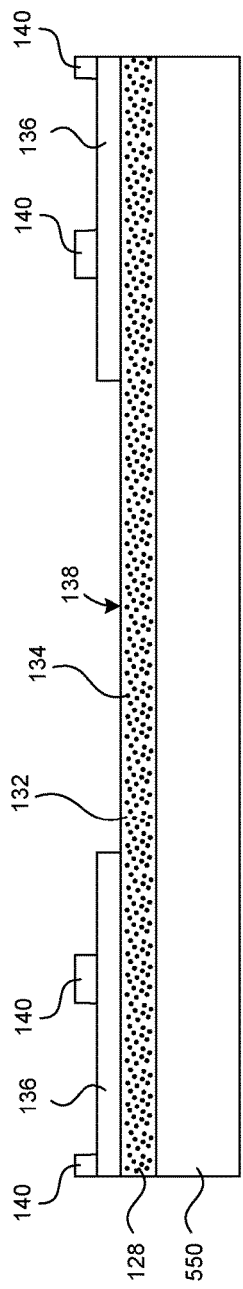

SOLID-STATE RADIATION TRANSDUCER DEVICES HAVING FLIP-CHIP MOUNTED SOLID-STATE RADIATION TRANSDUCERS AND ASSOCIATED SYSTEMS AND METHODS

CROSS-REFERENCE TO RELATED APPLICATIONS

This application is a continuation of U.S. application Ser. No. 14/603,102 filed Jan. 22, 2015, which is a divisional of U.S. patent application Ser. No. 13/219,530 filed Aug. 26, 2011, now issued as U.S. Pat. No. 8,952,402. The foregoing applications are incorporated herein by reference in their entireties.

TECHNICAL FIELD

The present technology is related to solid-state radiation transducer devices and methods of manufacturing solid-state radiation transducer devices. In particular, the present technology relates to solid-state radiation transducer devices having flip-chip mounted solid-state radiation transducers and associated systems and methods.

BACKGROUND

Numerous mobile electronic devices (e.g., mobile phones, personal digital assistants, digital cameras, and MP3 players) and other devices (e.g., televisions, computer monitors, and automobiles) utilize light-emitting diodes ("LEDs"), organic light-emitting diodes ("OLEDs"), polymer light-emitting diodes ("PLEDs"), and other solid-state radiation transducers ("SSRTs") for backlighting. SSRTs are also used for signage, indoor lighting, outdoor lighting, and other types of general illumination. To function in such applications, SSRTs generally must be packaged with other components to form SSRT devices. Conventional SSRT devices can include, for example, a back-side support for the SSRT (e.g., a mount), a heat sink, device leads, wires connecting the SSRT to the device leads, an optical component (e.g., a phosphor), and an encapsulant. Each of these components can serve one or more of several functions, including: (1) supporting the SSRT, (2) protecting the SSRT, (3) dissipating heat during operation of the SSRT, (4) modifying emissions from the SSRT (e.g., changing the color of the SSRT emissions), and (5) integrating the SSRT with the circuitry of external systems.

Conventional flip-chip mounting methods generally connect solid-state components to other device components without using wire bonds or other wires. Typically, in these methods, processing equipment deposits solder bumps onto contacts of the solid-state component, aligns the solder bumps with electrodes of the other device component, places the solder bumps onto the corresponding electrodes of the other device component, and reflows the solder bumps. An underfill material is often disposed in the space between the mounted solid-state component and the other device component.

Wire bonding, in contrast to flip-chip mounting, is used to connect conventional SSRTs to other device components. Wire bonding, however, has several disadvantages. For example, wire bonds require a significant amount of physical space. This can be problematic in miniaturized applications and applications with multiple SSRTs tightly grouped. In addition, wire bond formation is an intricate process requiring time on expensive equipment. Once formed, wire bonds are among the least reliable portions of SSRT packaging. For example, differential thermal expansion of the wires and the SSRTs can stress the wires over time and eventually lead to failure. In view of these and/or other deficiencies of conventional SSRT devices, there remains a need for innovation in this field.

BRIEF DESCRIPTION OF THE DRAWINGS

Many aspects of the present disclosure can be better understood with reference to the following drawings. The components in the drawings are not necessarily to scale. Instead, emphasis is placed on illustrating clearly the principles of the present disclosure. In the drawings, like reference numerals designate corresponding parts throughout the several views.

FIGS. 11A-11E are schematic cross-sectional views illustrating a process of forming an SSRT device in accordance with an embodiment of the present technology.

DETAILED DESCRIPTION

Specific details of several embodiments of solid-state radiation transducer ("SSRT") devices and associated systems and methods are described below. The terms "SSRT" and "radiation transducer" generally refer to die or other structures that include a semiconductor material as the active medium to convert electrical energy into electromagnetic radiation in the visible, ultraviolet, infrared, and/or other spectra. For example, SSRTs include solid-state light emitters (e.g., LEDs, laser diodes, etc.) and/or other sources of emission other than electrical filaments, plasmas, or gases. SSRTs can alternately include solid-state devices that convert electromagnetic radiation into electricity. Additionally, depending upon the context in which it is used, the term "substrate" can refer to a wafer-level substrate or to a singulated device-level substrate. A person skilled in the relevant art will also understand that the technology may have additional embodiments, and that the technology may be practiced without several of the details of the embodiments described below with reference to FIGS. 1-11.

In certain applications, many functions of conventional SSRT packages are unnecessary. For example, some conventional SSRT devices are incorporated into systems that have components for adequate support, protection, and heat dissipation, causing such components of conventional SSRT packages to be redundant. Furthermore, certain components of conventional SSRT packages can cause reliability problems. For example, SSRTs operate at high temperatures and the different expansion and contraction of the different components of the SSRTs can cause the failure of connections between the SSRTs and the wires conventionally used to connect SSRTs to device leads. Several embodiments of the present technology eliminate wire bonds and unnecessary packaging elements while preserving full functionality with a form of flip-chip mounting.

Figure 1:
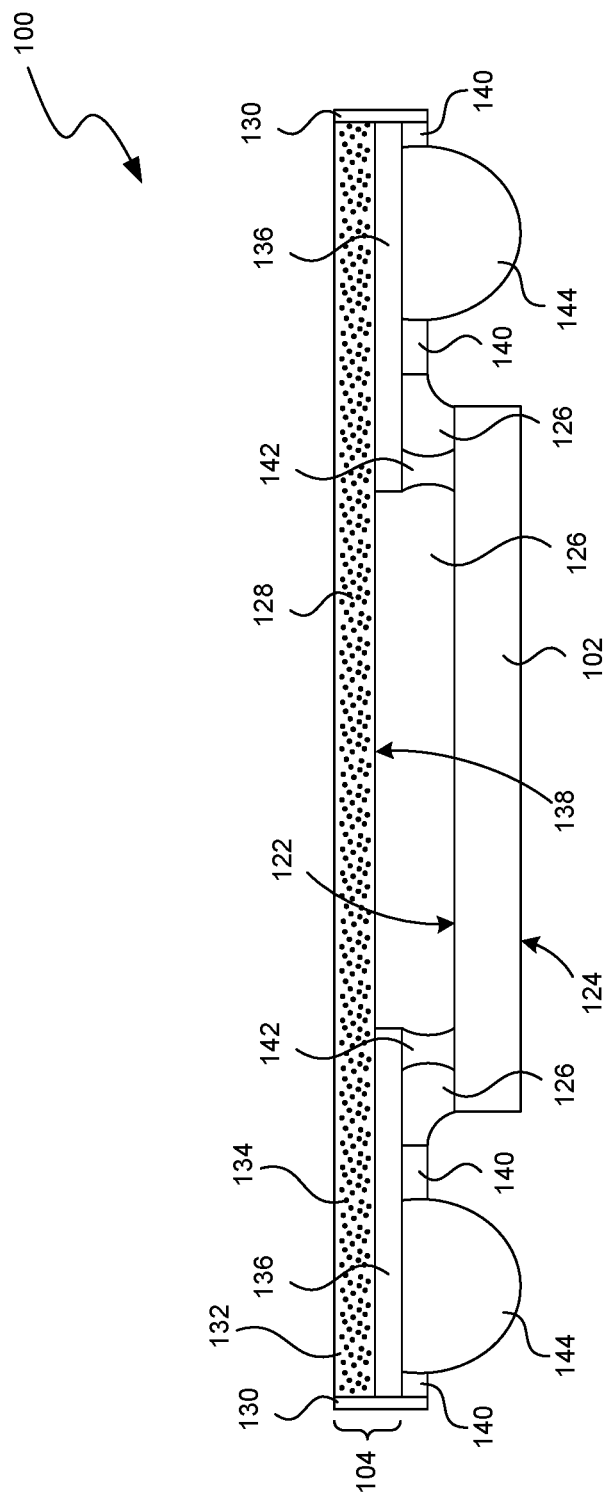
FIG. 1 is a schematic cross-sectional diagram of an SSRT device in accordance with an embodiment of the present technology.

FIG. 1 is a schematic cross-sectional view of an SSRT device 100 in accordance with an embodiment of the present technology. In one embodiment, the SSRT device 100 includes a radiation transducer 102, which is illustrated in more detail in FIG. 2, and a transmissive support assembly 104 electrically and mechanically coupled to the radiation transducer by a form of flip-chip mounting. At least a portion of the transmissive support assembly 104 is sufficiently transmissive to radiation that the radiation transducer 102 produces or receives. The transmissive support assembly 104 is also sufficiently rigid or of such mechanical strength that it protects and supports the radiation transducer 102 during handling and implementation. Conventional radiation transducers and other solid-state components often are flip-chip mounted to leads on opaque support structures. In contrast, as shown in FIG. 1, embodiments of the present technology can include a radiation transducer 102 flip-chip mounted to a structure that is at least partially transmissive, such as the transmissive support assembly 104. This configuration can eliminate the need for wire bonding and/or back-side support while still providing light modification and compatibility with the circuitry of external systems.

Figure 2:
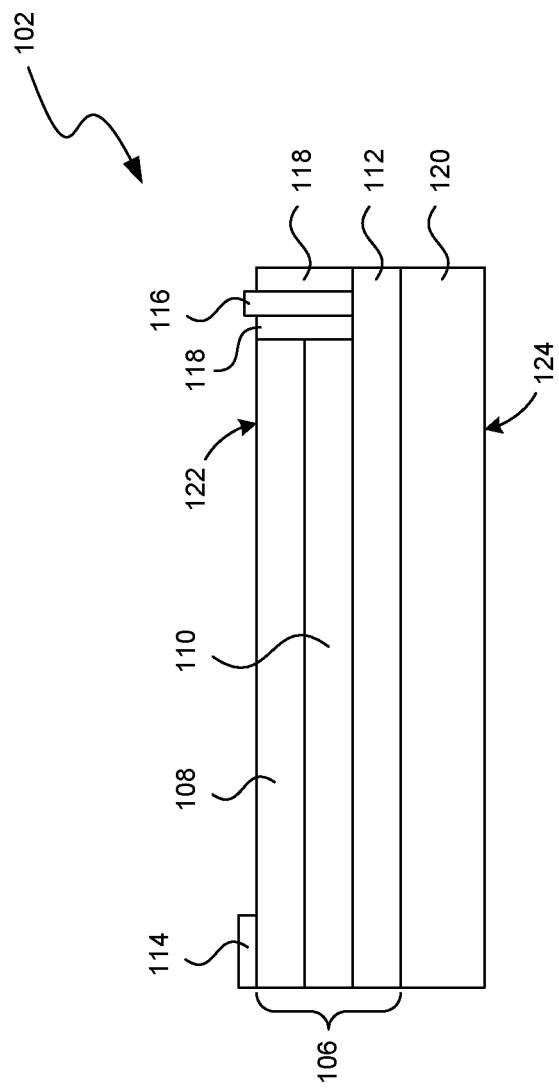
FIG. 2 is a schematic cross-sectional diagram of a radiation transducer within the SSRT device shown in FIG. 1.

As shown in FIG. 2, the radiation transducer 102 includes a transducer structure 106 having a first semiconductor material 108, an active region 110, and a second semiconductor material 112. The first semiconductor material 108 can be a P-type semiconductor material, such as P-type gallium nitride ("P-GaN"). The second semiconductor material 112 can be an N-type semiconductor material, such as N-type gallium nitride ("N-GaN"). The first and second semiconductor materials 108, 112 can individually include at least one of gallium arsenide (GaAs), aluminum gallium arsenide (AlGaAs), gallium arsenide phosphide (GaAsP), gallium (III) phosphide (GaP), zinc selenide (ZnSe), boron nitride (BN), aluminum gallium nitride (AlGaN), and/or other suitable semiconductor materials either instead of or in addition to N-GaN. The active region 110 can include a single quantum well ("SQW"), multiple quantum wells ("MQWs"), and/or a bulk semiconductor material. The term "bulk semiconductor material" generally refers to a single grain semiconductor material (e.g., indium gallium nitride ("InGaN")) with a thickness between approximately 10 nanometers and approximately 500 nanometers. In certain embodiments, the active region 110 can include an InGaN SQW, MQW, or gallium nitride/indium gallium nitride (GaN/InGaN) bulk material. In other embodiments, the active region 110 can include aluminum gallium indium phosphide (AlGaInP), aluminum gallium indium nitride (AlGaInN), and/or other suitable materials or configurations.

The radiation transducer 102 illustrated in FIG. 2 is a lateral type and includes first and second contacts 114, 116 connected to the first and second semiconductor materials 108, 112, respectively. The first and second contacts 114, 116 can include a metal, such as nickel (Ni), silver (Ag), copper (Cu), aluminum (Al), and tungsten (W). A dielectric material 118 isolates the second contact 116 from the first semiconductor material 108 and the active region 110. The dielectric material 118 can include silicon dioxide ($SiO_2$) and/or silicon nitride (SiN). The radiation transducer 102 can also include a carrier substrate 120 at the second semiconductor material 112. The carrier substrate 120 can be, for example, a metal (e.g., nickel (Ni) or gold (Au)), silicon, aluminum nitride, or sapphire. The radiation transducer 102 has an active side 122 and a back side 124. To improve emission from the active side 122 when the carrier substrate 120 is not reflective, a reflector can be positioned between the second semiconductor material 112 and the carrier substrate 120, such as a reflector including a metal (e.g., nickel (Ni) or gold (Au)).

Although illustrated in connection with a particular radiation transducer 102 shown in FIG. 2, embodiments of the disclosed technology can be used with virtually any radiation transducer 102, including radiation transducers having various contact structures (e.g., vertical and lateral radiation transducers) as well as radiation transducers having various sizes and shapes. Embodiments of the present technology also can be used with either single radiation transducers or multiple radiation transducers (e.g. one or more arrays of radiation transducers). The carrier substrate 120 is also optional. When present, the carrier substrate 120 is generally at the back side 124 of the radiation transducer 102 (as in the radiation transducer shown in FIG. 2), but in some cases, the carrier substrate can be at the active side 122 of the radiation transducer. When positioned at the active side 122 of the radiation transducer 102, the carrier substrate 120 can be made of a transparent material, such as sapphire.

In several embodiments of the present technology, the back side 124 of the radiation transducer 102 is an external surface of the SSRT device 100. This is different than conventional SSRT devices in which the SSRT is fully enclosed within packaging. Considering this, it can be useful to incorporate an SSRT 100 having a carrier substrate 120 made from a material well suited for direct exposure to an external system, such as a material with good corrosion resistance and durability. It also can be useful for the carrier substrate 120 to include a material of high thermal conductivity for improved heat dissipation. Examples of particularly suitable materials for the carrier substrate 120 include gold (Au) and aluminum nitride (AlN).

Referring back to FIG. 1, the illustrated embodiment of the SSRT device 100 further includes an underfill 126 between the radiation transducer 102 and the transmissive support assembly 104. The transmissive support assembly 104 includes a transmissive support member 128 and an edge reflector 130. The transmissive support member 128 can include a matrix material 132, such as a polymeric material, and a converter material 134, such as a cerium (III)-doped yttrium aluminum garnet (YAG) at a particular concentration in the matrix material for emitting a range of colors from green to yellow and to red under photoluminescence. In other embodiments, the converter material 134 can include neodymium-doped YAG, neodymium-chromium double-doped YAG, erbium-doped YAG, ytterbiumdoped YAG, neodymium-cerium double-doped YAG, holmium-chromium-thulium triple-doped YAG, thulium-doped YAG, chromium (IV)-doped YAG, dysprosium-doped YAG, samarium-doped YAG, terbium-doped YAG, and/or other suitable wavelength conversion materials. Emissions (e.g., light) from the transducer structure 106 (FIG. 2) can irradiate the converter material 134, and the irradiated converter material can emit a light of a certain quality (e.g., color, warmth, intensity, etc.). The edge reflector 130 can prevent or diminish light piping and emission loss through the edges of the transmissive support assembly 104. Suitable materials for the edge reflector 130 include silver (Ag) and gold (Au).

In the embodiment of the SSRT device 100 illustrated in FIG. 1, the transmissive support assembly 104 includes a single transmissive support member 128 and a single type of converter material 134 in the transmissive support member. Other embodiments can have more than one transmissive support member 128 within the transmissive support assembly 104. Each transmissive support member 128 can have no converter material 134, one converter material, or multiple converter materials. For example, several embodiments of the present technology can be configured as red-white-green-blue ("RWGB") devices. The transmissive support assembly 104 of such embodiments can include three converter materials 134. A first converter material 134 can be a yellow phosphor that mixes with blue light emitted by the transducer structure 106 to form a white pixel. Second and third converter materials 134 can be red and green phosphors, respectively, that fully convert the blue light from the transducer structure to form corresponding red and green pixels. The transducer structure 106 can create blue emissions without conversion. RWGB devices can be used in displays, monitors, televisions, and/or other suitable multi-color applications.

The transmissive support assembly 104 can also include conductive routing having a plurality of leads 136 patterned on the transmissive support member 128. The leads 136, for example, can be copper (Cu) or aluminum (Al) traces with pads that are photo-patterned on a back side 138 of the transmissive support member 128. In several embodiments, the leads each include two or more pads sized to receive a solder bump and a trace between the pads. The transmissive support assembly 104 can further include a solder mask 140 patterned over the leads 136 and the back side 138 of the transmissive support member 128 to have openings over the pads of the leads 136. The solder mask 140 can include dielectric material, such as silicon dioxide (SiO$_2$), silicon nitride (SiN), and/or other suitable dielectric materials.

The radiation transducer 102 is effectively packaged on the transmissive support assembly 104. For example, the SSRT device 100 can include solder connections 142 between bond pads (not shown) on the active side 122 of the radiation transducer 102 and the leads 136 on the back side 138 of the transmissive support member 128, and external solder bumps 144 partially isolated within the openings of the solder mask 140. In the illustrated embodiment, the external solder bumps 144 are the only external electrodes for the SSRT device 100. Other embodiments can have additional external electrodes, or another electrode configuration. For example, in several embodiments, the radiation transducer 102 is a vertical device and the back side 124 of the radiation transducer includes an additional external electrode. These embodiments can include additional solder on the back side 124 of the radiation transducer 102 to facilitate electrical connection of the back side of the radiation transducer to an external system.

The solder connections 142 and external solder bumps 144 can include any solder material known in the semiconductor fabrication arts. In several embodiments, the solder connections 142 and external solder bumps 144 include gold (Au), nickel (Ni), copper (Cu), aluminum (Al), tungsten (W), and/or other suitable electrically conductive materials. The solder connections 142 and external solder bumps 144 also can include a conductive polymer (e.g., polyacetylene, polypyrrole, or polyaniline). Since the solder connections 142 and leads 136 can be positioned on the active side 122 of the radiation transducer 102, output from the SSRT device 100 can potentially be improved by the use of transparent conductive materials. For example, the solder connections 142 and/or leads 136 can include indium tin oxide (ITO).

The underfill 126 surrounds the solder connections 142 and occupies the remaining space between the radiation transducer 102 and the transmissive support assembly 104. The underfill 126 can, for example, absorb stress caused by differential thermal expansion and contraction of the radiation transducer 102 and the transmissive support assembly 104. This prevents such expansion and contraction from causing damage to the solder connections 142, which could result in device failure. Suitable materials for the underfill 126 include substantially optically clear materials, such as substantially optically clear silicone or substantially optically clear epoxy. In several embodiments, the underfill material is the same as the matrix material 132 of one or more transmissive support members 128 of the transmissive support assembly 104.

Figure 3:
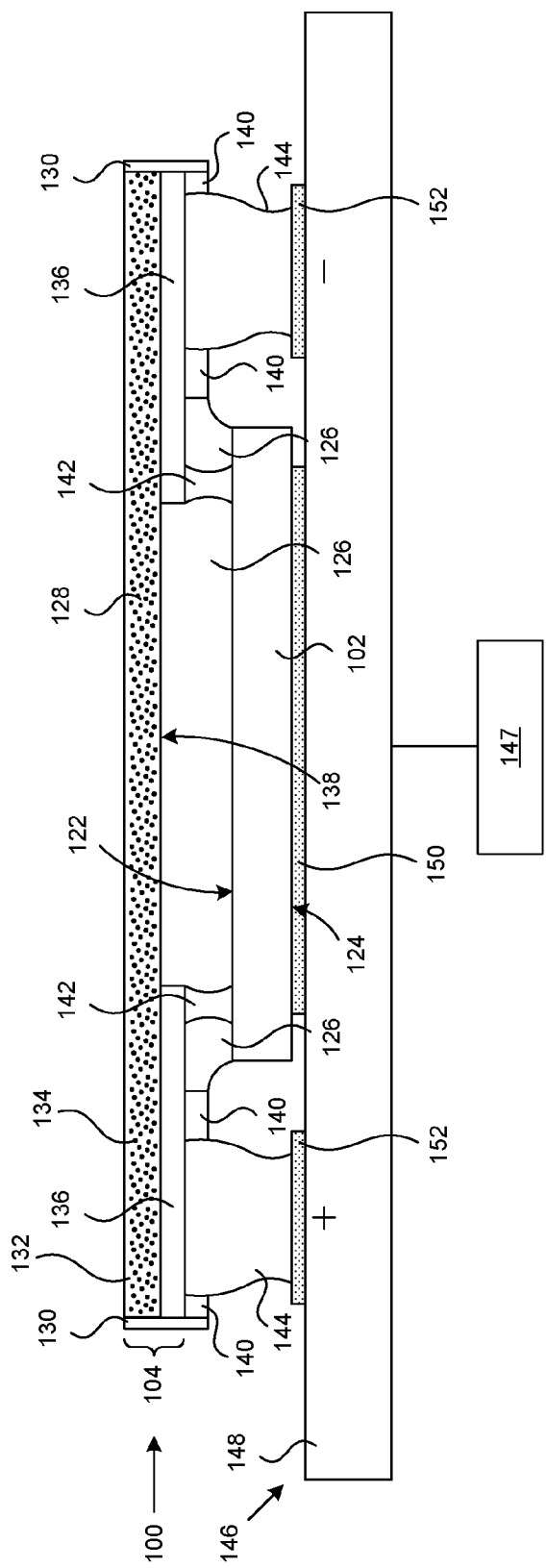
FIG. 3 is a schematic cross-sectional diagram of a system including the SSRT device shown in FIG. 1 on an external system mount of a primary component.

FIG. 3 illustrates the SSRT device 100 connected to one example of an external system mount 146 of a primary component 147 (e.g., a light, electrical appliance, vehicle or other product into which the SSRT device 100 can be integrated). The external system mount 146 includes a substrate 148, a mount 150, and two system electrodes 152. To connect the SSRT device 100 to the external system mount 146, the SSRT device can be placed on the external system mount such that the external solder bumps 144 are aligned with the system electrodes 152. The external solder bumps 144 then can be reflowed. The radiation transducer 102 can rest on the mount 150, be bonded to the mount (e.g. with adhesive), or be suspended near the mount. In some external system mounts 146, the mount 150 includes a cradle or other recess for supporting the radiation transducer 102. The external system mount 146 also can include no mount 150 and the solder bonds formed from reflowing the external solder bumps 144 can provide mechanical support for the SSRT device 100.

In the illustrated SSRT device 100 having a lateral-type radiation transducer 102, one of the external solder bumps 144 is a P-type connection and the other external solder bump is an N-type connection. As shown in FIG. 3, these external solder bumps 144 are connected to P-type (+) and N-type (−) system electrodes, respectively. In embodiments in which the radiation transducer 102 includes a back-side contact, the mount 150 can include an additional system electrode. For example, in embodiments including a vertical-type radiation transducer 102, a back-side contact of the radiation transducer can be soldered to a system electrode on or in place of the mount 150. In such embodiments, the system electrode connected to the back side 124 of the radiation transducer 102 can be P-type and the other electrodes can be N-type or the system electrode connected to the back side of the radiation transducer can be N-type and the other electrodes can be P-type.

The first and second contacts 114, 116 of the radiation transducer 102 shown in FIG. 2 are substantially coplanar on the active side 122 of the radiation transducer. This configuration facilitates flip-chip mounting because solder connections 142 of substantially the same size can be used to connect two or more substantially coplanar contacts on one surface to two or more substantially coplanar leads on another surface. This feature, however, is not necessary. Several embodiments include radiation transducers 102 having non-coplanar contacts on the active side 122. In these embodiments, different sized solder connections 142 can exist between the radiation transducer 102 and the leads 136 of the transmissive support assembly 104. Alternatively, other portions of the SSRT device 100 can be formed nonsymmetrically to accommodate different contact positions on the radiation transducer 102. For example, the leads 136 can have different thicknesses or be placed on one or more spacer layers.

The external solder bumps 144 of the SSRT device 100 are substantially symmetrical and extend away from the transmissive support assembly 104 to a plane substantially even with the back side 124 of the radiation transducer 102. This configuration is suitable for connecting the SSRT device 100 to an external system mount 146 in which the mount 150 and the system electrodes 152 are substantially coplanar, such as the external system mount 146 shown in FIG. 3. For connecting to external system mounts 146 having different configurations, the external solder bumps 144 can be differently sized, such as to extend to different vertical positions relative to the back side 124 of the radiation transducer 102. Other portions of the SSRT device 100 also can be configured differently with features such as those described above for accommodating contacts of the radiation transducer 102 having different vertical positions. The horizontal positions of the external solder bumps 144 can be easily modified, for example, by extending or shortening the leads 136. For greater versatility, the external solder bumps 144 also can be replaced with other electrical connection types, such as wires. Wires used in place of the external solder bumps 144 can be more reliable than wires used in conventional SSRT devices to connect SSRTs to other device components. Wires used in place of the external solder bumps 144, for example, can be compositionally similar to the leads 136, and therefore not be subject to stress from differential thermal expansion.

In several embodiments of the present technology, the transmissive support assembly 104 is formed separately from the radiation transducer 102. In contrast, transmissive components of many conventional SSRT devices are formed directly on the radiation transducers (e.g., by depositing a material onto a surface of a radiation transducer). Forming the transmissive support assembly 104 separately can be advantageous because certain formation processes, such as molding, are difficult to execute directly on a radiation transducer surface. Molding in particular can be used to form portions of transmissive support assemblies 104, such as the transmissive support member 128 shown in FIG. 1, having a variety of useful shapes and surface characteristics. Transmissive components formed directly on radiation transducers can be limited in size and shape in conventional designs. In contrast, embodiments of the present technology can include transmissive support members 128 for which the size and shape are determined independently of the size and shape of the radiation transducer 102 or the number of radiation transducers in an array. Transmissive support members 128 of these embodiments, therefore, often can be sized and shaped according to the specifications of secondary optical components or other structures of external systems into which the SSRT devices 100 will be incorporated. For example, some external systems include reflector cavities, Fresnel lenses, and/or pillow lenses that modify emissions from the SSRT device 100. Transmissive support members 128 of several embodiments of the present technology can be sized and shaped according to the specifications of such structures so that the SSRT devices 100 integrate effectively with such structures. For example, the transmissive support members 128 of several embodiments of the present technology are sized and shaped to support or fit inside certain components of external systems, such as certain secondary optical components.

As shown, for example, in FIG. 1, the transmissive support assembly 104 can be spaced apart from the radiation transducer 102 with solder connections 142 and the underfill material 126 in the intervening space. Spacing transmissive support members 128 apart from the radiation transducers 102 in this manner can be advantageous. For example, it can be difficult to form transmissive components that are relatively thick, dimensionally uniform, and/or uniform in converter concentration when forming such components directly on radiation transducer surfaces. Multiple radiation transducers in an array can also be mounted to a transmissive support member 128 that is spaced apart from the radiation transducer array. Furthermore, some materials useful for transmissive components, such as certain polymers, can be darkened or otherwise damaged by heat from direct contact with radiation transducers during operation. Spacing these materials apart from the radiation transducers can prevent such damage from occurring.

Figure 4:
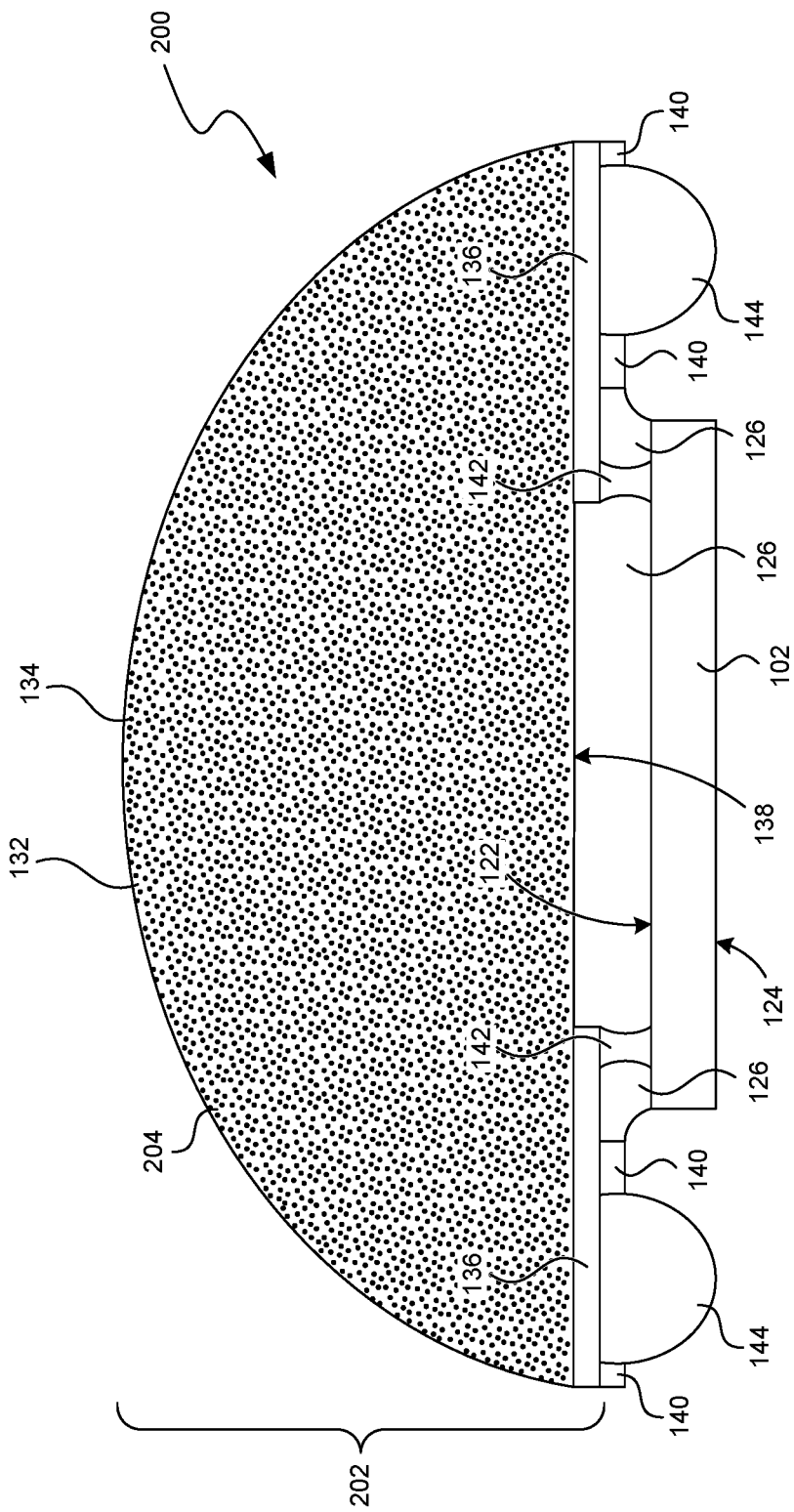
FIG. 4 is a schematic cross-sectional diagram of an SSRT device in accordance with another embodiment of the present technology.
Figure 5:
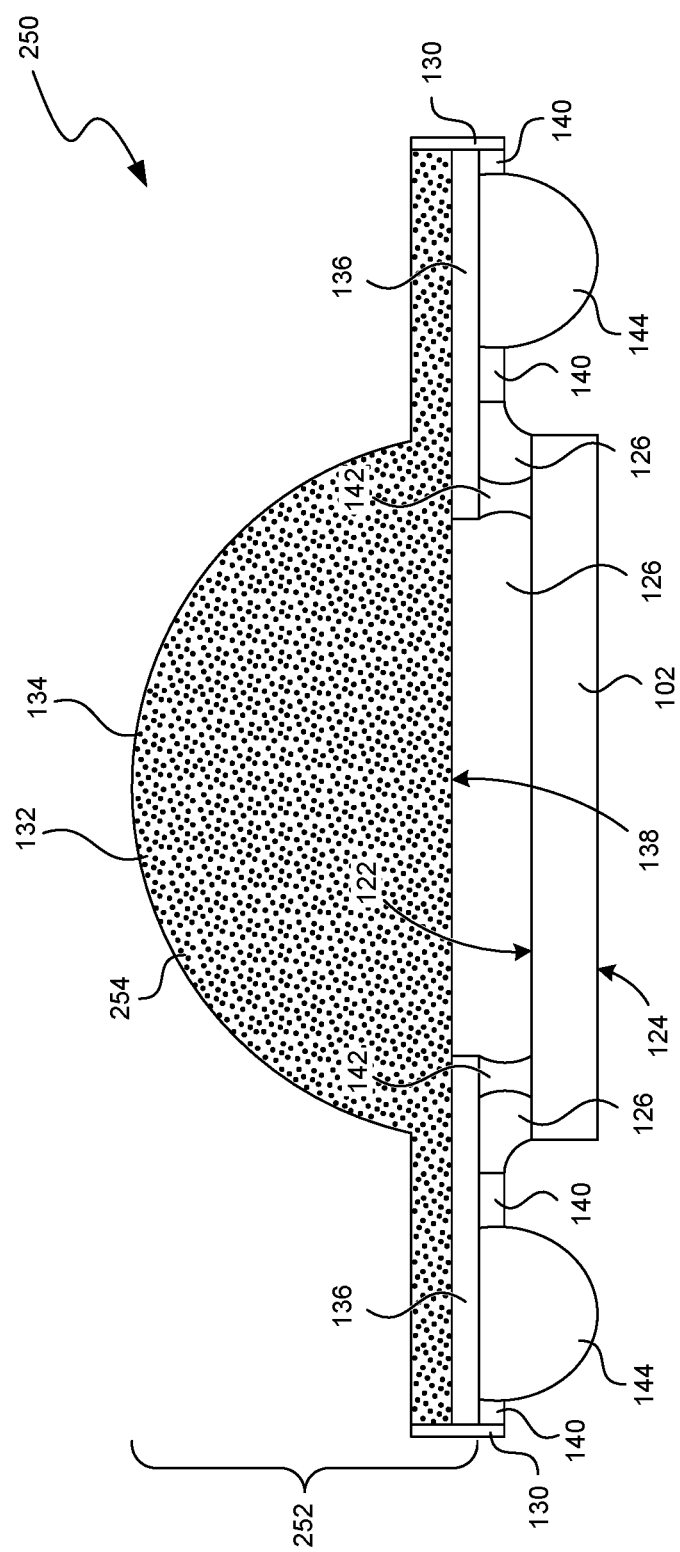
FIG. 5 is a schematic cross-sectional diagram of an SSRT device in accordance with another embodiment of the present technology.

FIG. 4 illustrates an SSRT device 200 including a transmissive support assembly 202 having a transmissive support member 204 that is substantially hemispherical and extends over substantially the entire surface of the SSRT device. FIG. 5 illustrates an SSRT device 250 including a transmissive support assembly 252 having a transmissive support member 254 that is substantially planar near the edges and substantially hemispherical over a central portion of the SSRT device.

Figure 6:
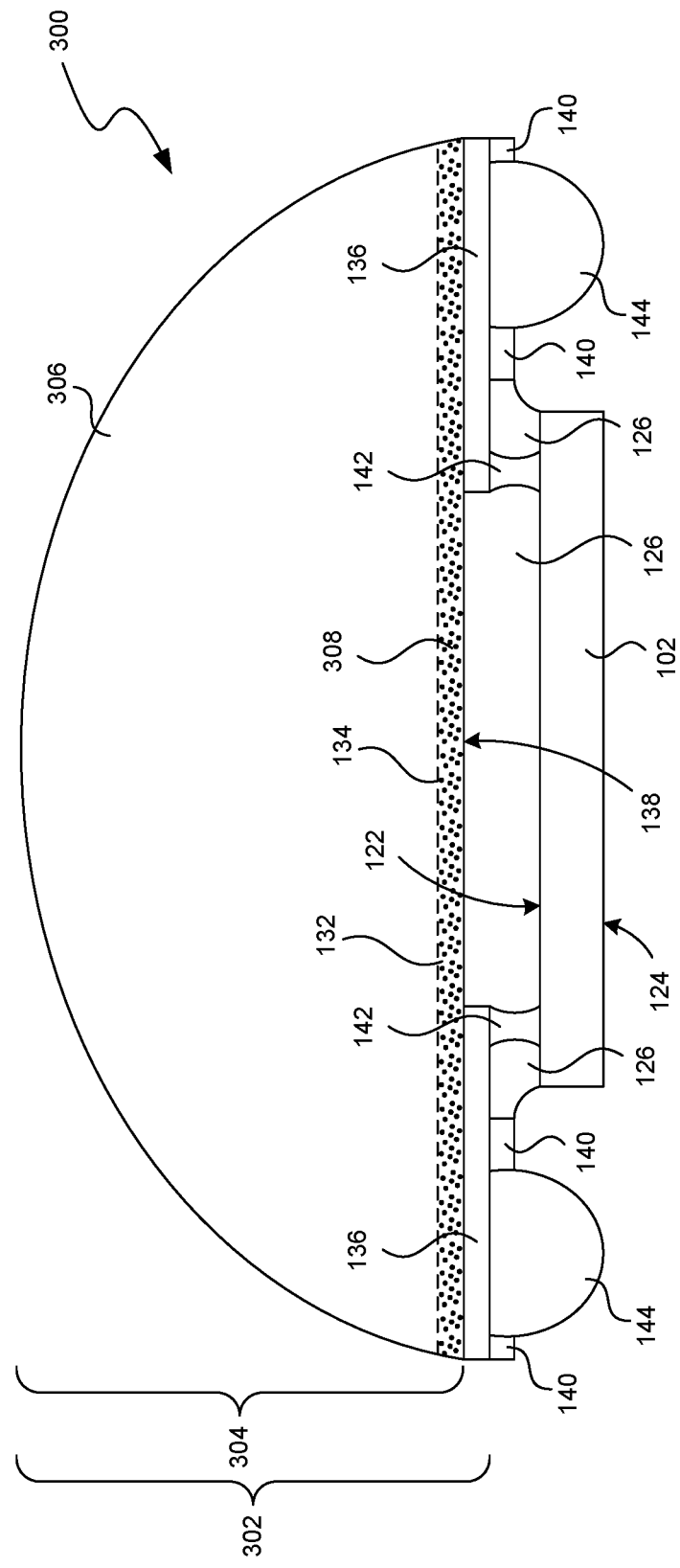
FIG. 6 is a schematic cross-sectional diagram of an SSRT device in accordance with another embodiment of the present technology.
Figure 7:
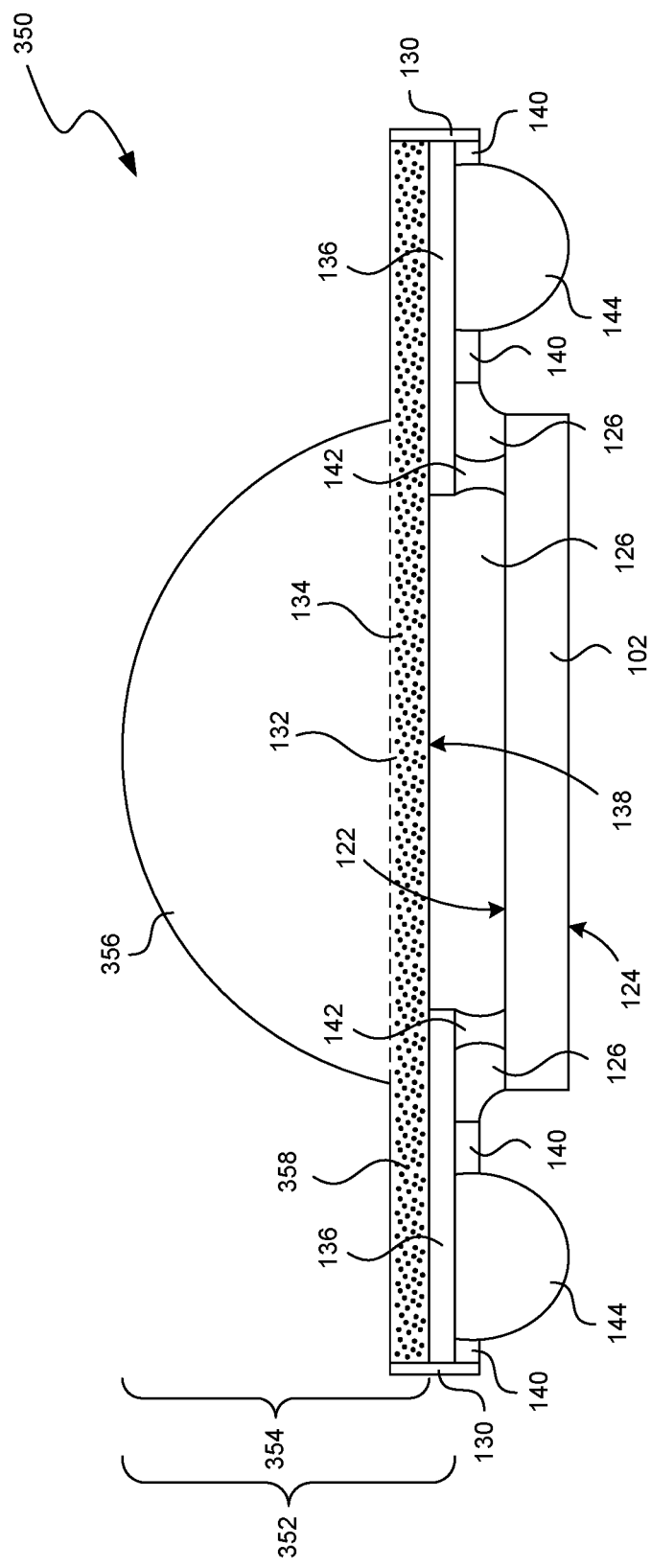
FIG. 7 is a schematic cross-sectional diagram of an SSRT device in accordance with another embodiment of the present technology.

In the SSRT devices 200, 250 of FIGS. 4 and 5, the transmissive support members 204, 254 include substantially uniform distributions of converter material 134. In other embodiments, the distribution of converter material 134 in the transmissive support members can be non-uniform. FIG. 6 illustrates an SSRT device 300 similar to the SSRT device 200 of FIG. 4, but with a transmissive support assembly 302 having a transmissive support member 304 including a non-uniform distribution of converter material 134. FIG. 7 illustrates an SSRT device 350 similar to the SSRT device 250 of FIG. 5, but with a transmissive support assembly 352 having a transmissive support member 354 including a non-uniform distribution of converter material 134. The transmissive support member 304 of FIG. 6 includes a first portion 306 having a low concentration of converter material 134 or no converter material and a second portion 308 having a relatively high concentration of converter material. Similarly, the transmissive support member 354 of FIG. 7 includes a first portion 356 having a low concentration of converter material 134 or no converter material and a second portion 358 having a relatively high concentration of converter material. In FIGS. 6 and 7, the division between the first portions 306, 356 of the transmissive support members 304, 354 and the second portions 308, 358 of the transmissive support members 304, 354 are indicated with dashed lines because the first and second portions are within the same transmissive support members. Other embodiments can include separate transmissive support members having different concentrations of converter material, such as separate transmissive support members resembling the first portions 306, 356 and second portions 308, 358 of the transmissive support members 304, 354 shown in FIGS. 6 and 7.

Figure 8:
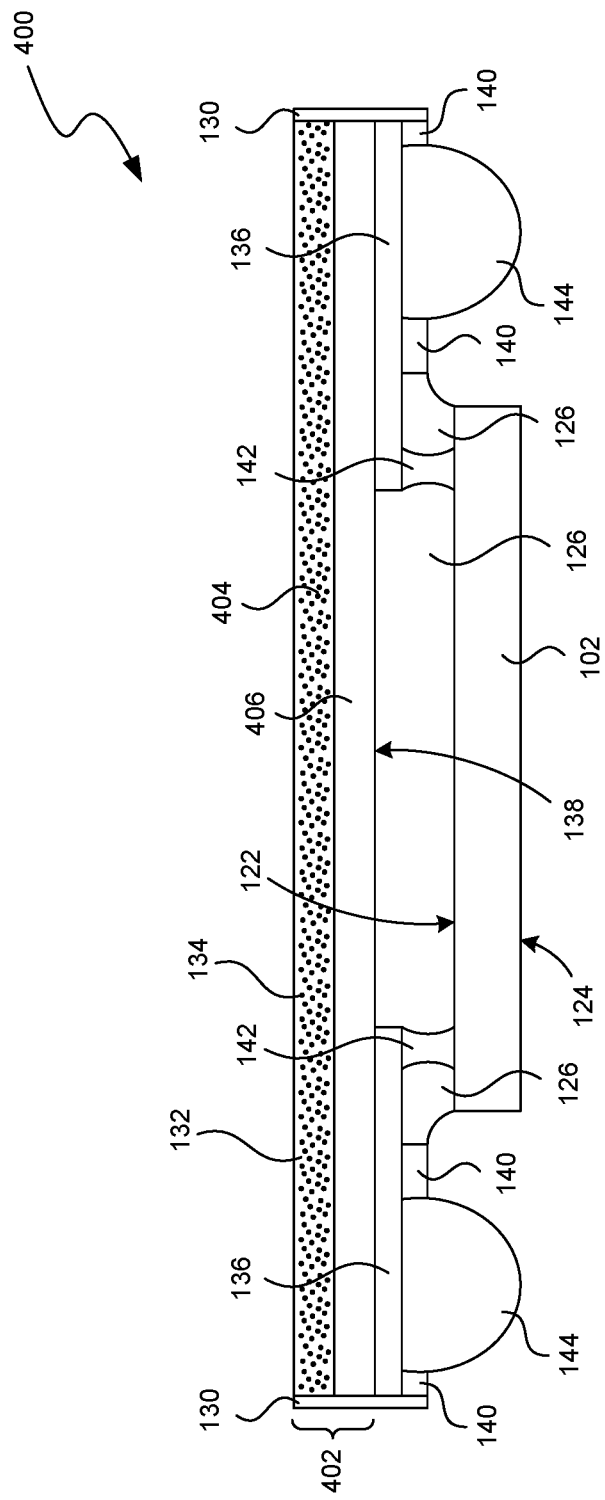
FIG. 8 is a schematic cross-sectional diagram of an SSRT device in accordance with another embodiment of the present technology.

FIG. 8 illustrates an SSRT device 400 having a transmissive support assembly 402 including a first transmissive support member 404 and a second transmissive support member 406. The first transmissive support member 404 includes a converter material 134. The second transmissive support member 406 is a transition layer positioned between the radiation transducer 102 and the first transmissive support member 404. Other embodiments can include a transition layer as the only transmissive support member, a transition layer at a different position within the transmissive support assembly, or multiple transition layers within the transmissive support assembly. The second transmissive support member 406 can be made of a material with a refractive index between the refractive index of the transducer structure 106 of the radiation transducer 102 and a refractive index of the first transmissive support member 404 positioned further from the radiation transducer than the second transmissive support member. In several embodiments, a transmissive support member that is a transition layer has a refractive index from about 1.6 to about 1.9. Passing emissions from a radiation transducer 102 through such a material generally improves the output of the SSRT device 400 by reducing refraction and associated back reflection. Examples of suitable materials for the second transmissive support member 406 include glass, triacetyl cellulose, polyethylene terephthalate, and polycarbonate.

Figure 9:
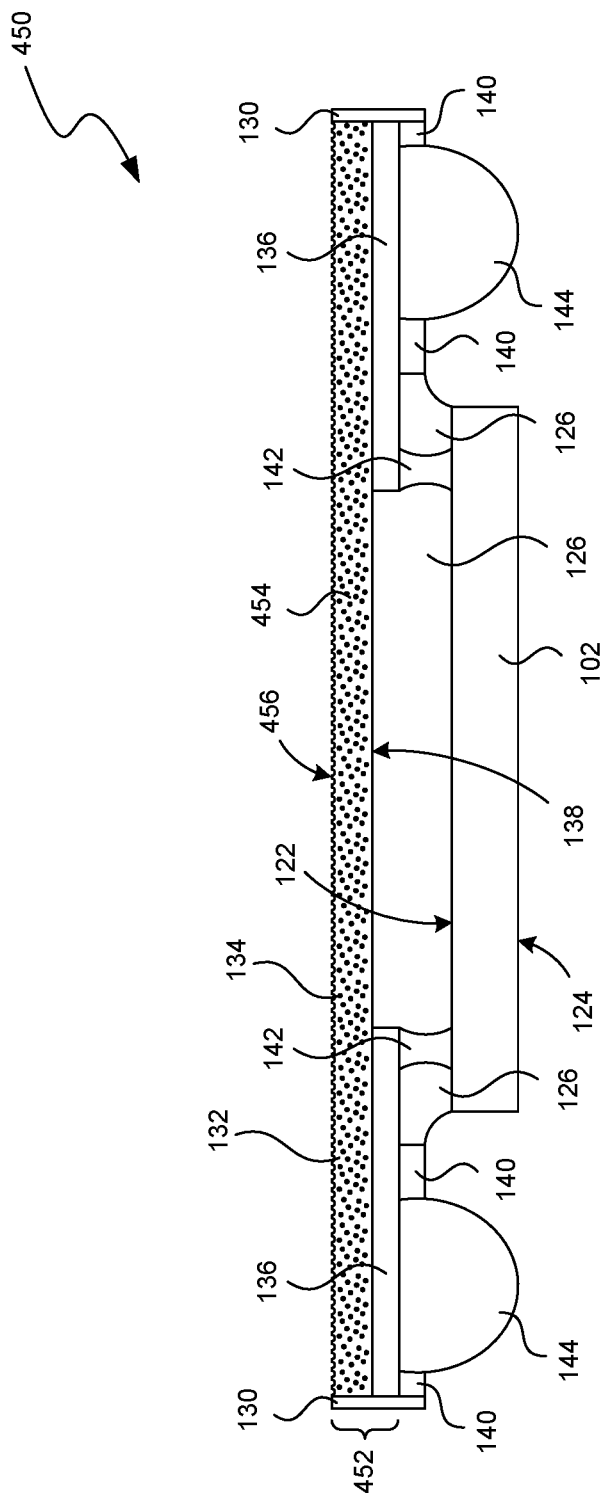
FIG. 9 is a schematic cross-sectional diagram of an SSRT device in accordance with another embodiment of the present technology.
Figure 10:
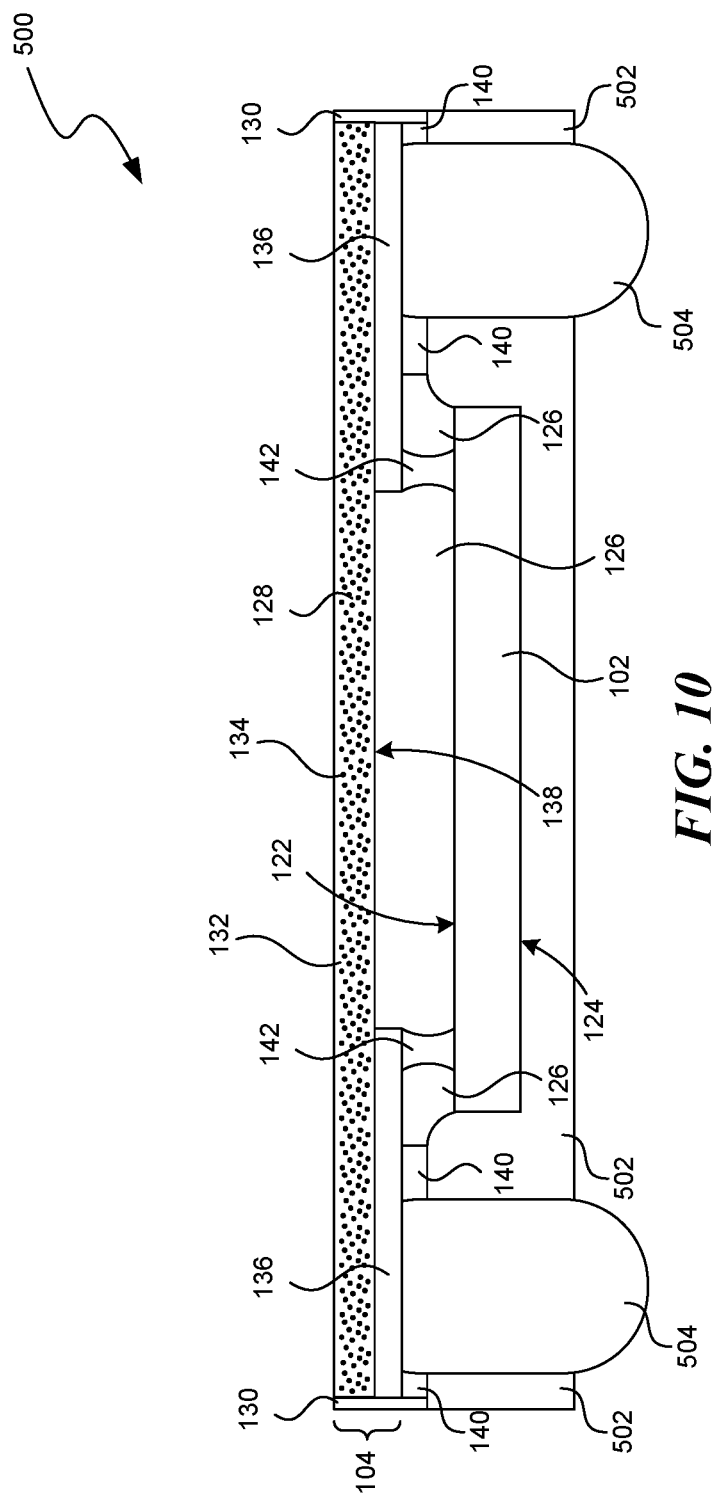
FIG. 10 is a schematic cross-sectional diagram of an SSRT device in accordance with another embodiment of the present technology.

In several embodiments of the present technology, the exterior surface of or an interface within the transmissive support assembly can be roughened and/or textured. FIG. 9 illustrates an SSRT device 450 having a transmissive support assembly 452 with a transmissive support member 454 having a textured surface 456. Including a textured surface, such as the textured surface 456, can improve the output from the SSRT device 450 by, for example, reducing the total internal reflection within the transmissive support assembly 452. The texturing can include regular patterning, random patterning, micropatterning, and/or macropatterning. Methods for texturing include photolithography, etching, and abrasion after the transmissive support member is formed. Molding, discussed in greater detail below, also can be used to alter the surface characteristics of a transmissive support member in embodiments of the present technology FIG. 10 illustrates an SSRT device 500 including an encapsulant 502 around the majority of the back side of the SSRT device. The encapsulant 502 can protect the radiation transducer 102 and other portions of the SSRT device 500 as well as dissipate heat from the radiation transducer during operation. Suitable materials for the encapsulant 502 include polymeric materials, such as clear and opaque epoxies. The external solder bumps 504 are larger than the external solder bumps 144 shown in FIGS. 1 and 3-9 so as to extend beyond the outer surface of the encapsulant 502. When connecting the SSRT device 500 to an external system mount 146, the bottom surface of the encapsulant 502 can rest on the mount 150, be bonded to the mount (e.g. with adhesive), or be suspended near the mount. If the radiation transducer 102 includes a back-side contact, an electrode can extend through the encapsulant 502 for connection to an external electrode.

Figure 11D:
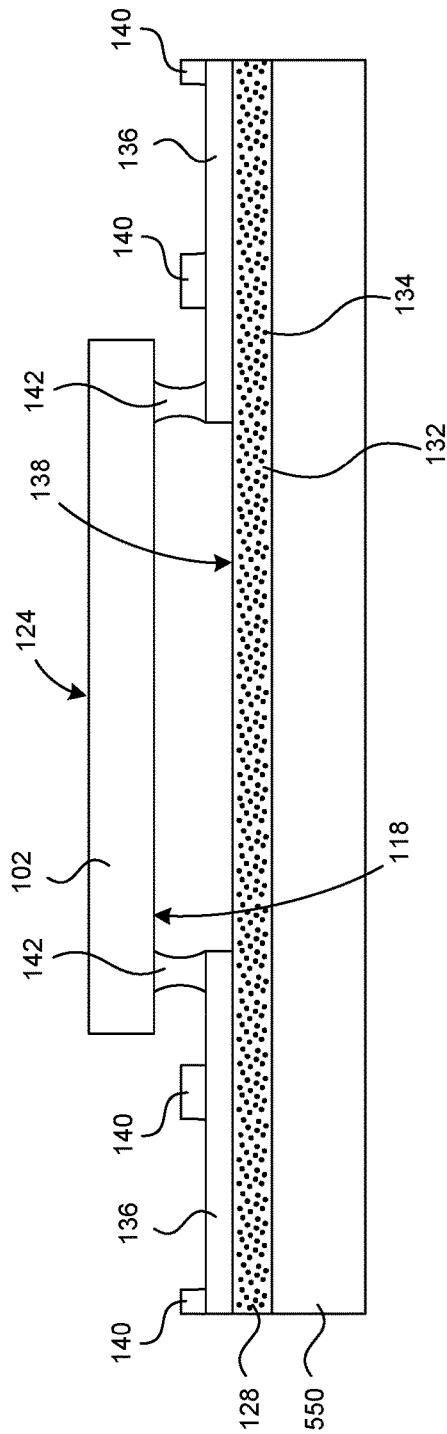

FIGS. 11A-11E illustrate a process of forming the SSRT device 100 in accordance with an embodiment of the present technology. FIG. 11A shows a stage of the process after the transmissive support member 128 has been formed on a formation substrate 550. The formation substrate 550 can be any substrate rigid enough or of sufficient mechanical strength to support the transmissive support member 128. For example, the formation substrate 550 can be a silicon wafer, a polymer, glass or other type of wafer or sheet. The transmissive support member 128 can be formed on the formation substrate 550 by a technique such as molding, ink jetting, spin coating, chemical vapor deposition ("CVD"), or physical vapor deposition ("PVD"). With exceptions, molding typically is well suited for making thicker transmissive support members 128, such as transmissive support members with thicknesses greater than about 150 microns. Spin coating and other deposition processes typically are better suited for making thinner transmissive support members 128, such as those with thicknesses less than about 150 microns. Thicker transmissive support members 128 with a converter material 134 typically can achieve the same level of conversion as thinner transmissive support members that have lower concentrations of converter material. Thus, thicker transmissive support members 128 having a converter material 134 can be useful when thinner transmissive support members would require concentrations of converter material beyond saturation levels. As an alternative to making the transmissive support member 128 with a converter material 134, prefabricated transmissive support members having a converter material can be purchased, such as from Shin-Etsu Chemical Co., Ltd. (Tokyo, Japan).

In several embodiments of the present technology, a precursor material is deposited on a formation substrate 550 and then cured (e.g., ultrasonically or thermally) to form one or more transmissive support members 128 of the transmissive support assembly 104. Suitable precursor materials include liquids and/or powders as well as polymeric and/or nonpolymeric materials. Suitable precursor materials for transmissive support members 128 with a converter material 134 include epoxy resins containing phosphor particles. Rather than simple deposition, the precursor material also can be molded, such as injection molded. If molding is used, the formation substrate 550 can be a portion of a mold. Molding allows the formation of transmissive support members having a variety of shapes and sizes, such as the transmissive support members 128, 204, 254, 304, 354, 404, 406 shown in FIGS. 1 and 4-8. Molding also can be used to form transmissive support members having different surface characteristics, such as the transmissive support member 454 shown in FIG. 9, which has a textured surface 456. A texture pattern, for example, can be incorporated into a portion of a mold.

Some molding techniques can be used to form transmissive support members having different portions with different concentrations of converter material 134, such as the transmissive support members 304, 354 of FIGS. 6 and 7. For example, a precursor material can be molded and then allowed to rest during a period prior to curing while gravity causes particles of converter material 134 to settle. Using gravity, the orientation of the molded precursor material relative to the direction of the force of gravity during the period prior to curing determines the configuration of the final transmissive support member. Alternatively, the molded precursor material can be placed in a centrifuge and the orientation of the molded precursor material relative to the direction of the centrifugal force during the period prior to curing determines the configuration of the final transmissive support member. Suitable machines for molding transmissive support members for use in embodiments of the present technology include TOWA Corporation (Kyoto, Japan) models LCM1010 and FFT1030W.

FIG. 11B shows a stage in the process after the leads 136 are formed on the transmissive support member 128, and FIG. 11C shows a stage after the solder mask 140 has been formed on the leads 136. The leads 136 and the solder mask 140 can be formed using any deposition and patterning technique known in semiconductor fabrication arts, such as CVD, PVD, or atomic layer deposition ("ALD") followed by photolithography.

Figure 11E:
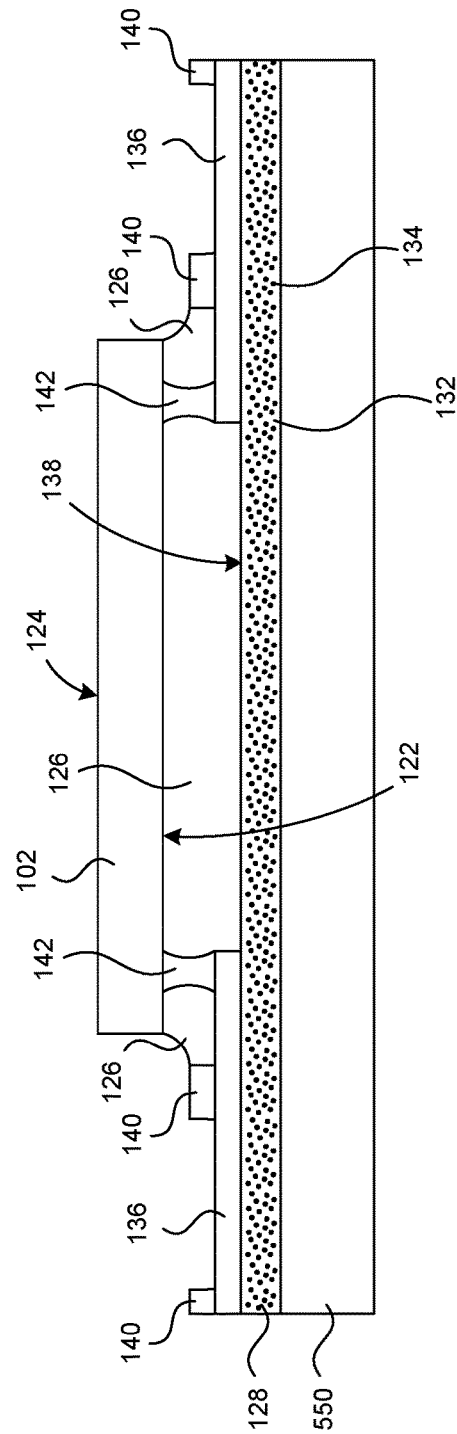

Separately from the steps shown in FIGS. 11A-11C, solder balls are deposited onto contacts on the active side 122 of the radiation transducer 102. The radiation transducer 102 is then flipped and placed on the structure shown in FIG. 11C, with the solder balls of the radiation transducer aligned with the leads 136. The solder is then reflowed (e.g., ultrasonically or thermally) resulting in the structure having the solder connections 142 shown in FIG. 11D. Alternatively, the solder balls can be placed on the leads 136 and the radiation transducer 102 placed onto the solder balls. As shown in FIG. 11E, the underfill 126 is then introduced into the area between the transmissive support member 128 and the radiation transducer 102. This can be done, for example, by injecting heated underfill material from the side of the structure shown in FIG. 11D and then curing the underfill material, such as with microwave radiation. The external solder bumps 144 are then deposited in the openings of the solder mask 140. Finally, the formation substrate 550 is separated from the transmissive support member 128 to form the SSRT device 100 shown in FIG. 1. Although not illustrated in FIGS. 11A-11E, the edge reflector 130 can be formed, for example, by etching trenches between and around individual SSRT devices within an array of SSRT devices and depositing a reflective material (e.g., silver (Ag)) into the trenches prior to forming the solder mask 140. Once completed, the array of SSRT devices can be diced along the centers of the trenches such that a portion of the reflective material remains on the edges of each SSRT device.

SSRT devices 100 according to embodiments of the present technology can be made using a variety of processes other than the process described with reference to FIGS. 11A-11E. For example, in several embodiments, no formation substrate 550 is used. Instead, the SSRT device 100 can be formed on a pre-formed, self-supporting transmissive support member 128 (e.g., a transmissive support member including a converter material 134 or a transmissive support member that is a transition layer). When a formation substrate 550 is used, the formation substrate can be removed at various times during the process. For example, the transmissive support assembly 104 can be formed on a formation substrate 550 and then removed from the formation substrate prior to mounting the radiation transducer 102. Furthermore, the radiation transducer 102 can be mounted to the transmissive support assembly 104 or the transmissive support assembly can be mounted to the radiation transducer.

From the foregoing, it will be appreciated that specific embodiments of the present technology have been described herein for purposes of illustration, but that various modifications may be made without deviating from the technology. For example, the embodiments illustrated in FIGS. 1-11 include two solder connections 142. Other embodiments of the present technology can include one, three, four, five, or a greater number of solder connections 142. Certain aspects of the present technology described in the context of particular embodiments may be combined or eliminated in other embodiments. For example, the transmissive support assembly 104 of the embodiment shown in FIG. 1 can include the second transmissive support member 406 of the embodiment shown in FIG. 8. Furthermore, while advantages associated with certain embodiments of the present technology have been described in the context of those embodiments, other embodiments may also exhibit such advantages, and not all embodiments need necessarily exhibit such advantages to fall within the scope of the technology. Accordingly, the disclosure and associated technology can encompass other embodiments not expressly shown or described herein.

I claim:

1. A method of making a light-emitting diode device, the method comprising flip-chip mounting a light-emitting diode onto a support member configured to convey an optical emission from the light-emitting diode, wherein flip-chip mounting the light-emitting diode onto the support member includes forming an optically transparent solder connection between the light-emitting diode and the support member.

2. The method of claim 1, further comprising disposing an optically transparent underfill material between the light-emitting diode and the support member.

3. The method of claim 1, further comprising forming the support member, wherein forming the support member includes spin coating a precursor material onto a substrate.

4. The method of claim 3 wherein the precursor material includes a curable matrix material and particles of converter material disposed within the matrix material.

5. The method of claim 1, further comprising forming the support member, wherein forming the support member includes molding a precursor material.

6. The method of claim 5 wherein the precursor material includes a curable matrix material and particles of converter material disposed within the matrix material.

7. The method of claim 6 wherein forming the support member includes: settling the particles of converter material within the matrix material; and curing the matrix material after settling the particles of converter material.

8. The method of claim 1, further comprising forming a lead on the support member, wherein forming the solder connection includes forming the solder connection between the lead and a contact of a light-emitting diode.

9. The method of claim 8 wherein: forming the lead includes forming a patterned lead having a pad and a trace extending from the pad; and forming the solder connection includes forming the solder connection between the pad and the contact.

10. The method of claim 8, further comprising forming a solder mask on the lead.

11. The method of claim 1 wherein forming the solder connection includes forming the solder connection such that the support member and the light-emitting diode are spaced apart on opposites sides of the solder connection.

12. The method of claim 1 wherein: the solder connection is a first solder connection; and the method further comprises forming a second solder connection between a lead on the support member and a system mount such that the light-emitting diode is between the support member and the system mount.

* * * * *